US012609157B2

(12) United States Patent
Brox et al.

(10) Patent No.: US 12,609,157 B2
(45) Date of Patent: Apr. 21, 2026

(54) TECHNIQUES AND DEVICES TO REDUCE BUS CROSS TALK FOR MEMORY SYSTEMS

(71) Applicant: Micron Technology, Inc., Boise, ID (US)

(72) Inventors: Martin Brox, Munich (DE); Milena Tsvetkova Ivanov, Munich (DE); Natalija Jovanovic, Munich (DE)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 18/588,686

(22) Filed: Feb. 27, 2024

(65) Prior Publication Data

US 2024/0321340 A1      Sep. 26, 2024

Related U.S. Application Data

(60) Provisional application No. 63/454,437, filed on Mar. 24, 2023.

(51) Int. Cl.
| | |
|---|---|
| *G11C 11/4096* | (2006.01) |
| *G11C 11/4074* | (2006.01) |
| *G11C 11/4093* | (2006.01) |

(52) U.S. Cl.
CPC ...... *G11C 11/4096* (2013.01); *G11C 11/4074* (2013.01); *G11C 11/4093* (2013.01)

(58) Field of Classification Search
CPC ................................................. G11C 11/4096
See application file for complete search history.

(56) References Cited

U.S. PATENT DOCUMENTS

| | | | | |
|---|---|---|---|---|
| 6,127,849 | A * | 10/2000 | Walker ........... | H03K 19/018592 327/27 |
| 2016/0042792 | A1 | 2/2016 | Kang et al. | |
| 2016/0094362 | A1 * | 3/2016 | Brennan ........... | H04L 12/40039 327/109 |
| 2018/0330781 | A1 | 11/2018 | Guliani et al. | |

(Continued)

OTHER PUBLICATIONS

"International Search Report and Written Opinion of the International Searching Authority," issued in connection with Int'l Appl. No. PCT/US2024/017793, dated Jun. 18, 2024 (9 pages).

*Primary Examiner* — Hoai V Ho
(74) *Attorney, Agent, or Firm* — Holland & Hart LLP

(57) ABSTRACT

Methods, systems, and devices for techniques and devices to reduce bus cross talk are described. Adjacent conductive lines in a bus of a memory system may be electrically coupled if both conductive lines are concurrently driven to a high-state. For example, the bus may include a logic circuit coupled between the adjacent conductive lines, which may selectively couple the conductive lines based on the voltage applied to each conductive line. In some examples, the logic circuit may include an input coupled to the control signals of the drivers associated with the adjacent conductive lines. If both control signals are concurrently high, the logic circuit may activate a transistor to couple the conductive lines. Such electrical coupling may reduce or eliminate the capacitive coupling between the two conductive lines when both are driven to a high state, which may result in increased reliability of signals in the conductive lines.

22 Claims, 7 Drawing Sheets

201

(56) References Cited

U.S. PATENT DOCUMENTS

| | | |
|---|---|---|
| 2018/0358083 A1 | 12/2018 | Kawamura et al. |
| 2019/0287583 A1 | 9/2019 | Hollis |
| 2019/0295625 A1 | 9/2019 | Lee et al. |

* cited by examiner

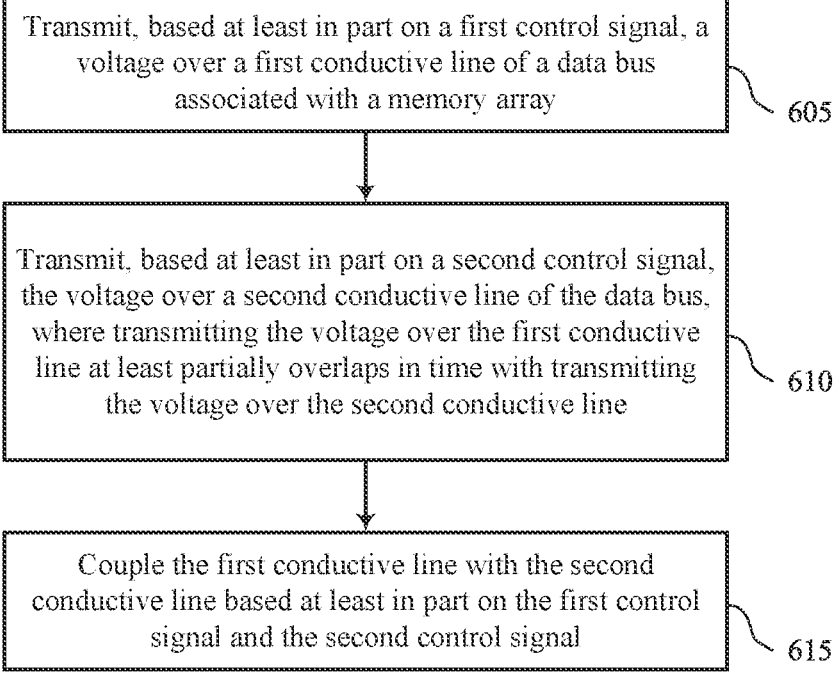

Transmit, based at least in part on a first control signal, a voltage over a first conductive line of a data bus associated with a memory array

605

Transmit, based at least in part on a second control signal, the voltage over a second conductive line of the data bus, where transmitting the voltage over the first conductive line at least partially overlaps in time with transmitting the voltage over the second conductive line

610

Couple the first conductive line with the second conductive line based at least in part on the first control signal and the second control signal

TECHNIQUES AND DEVICES TO REDUCE BUS CROSS TALK FOR MEMORY SYSTEMS

CROSS REFERENCE

The present Application for Patent claims priority to U.S. Patent Application No. 63/454,437 by Brox et al., entitled "TECHNIQUES AND DEVICES TO REDUCE BUS CROSS TALK FOR MEMORY SYSTEMS," filed Mar. 24, 2023, which is assigned to the assignee hereof, and which is expressly incorporated by reference herein.

TECHNICAL FIELD

The following relates to one or more systems for memory, including techniques and devices to reduce bus cross talk for memory systems.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 6 illustrates a flowchart showing a method or methods that support techniques and devices to reduce bus cross talk in accordance with examples as disclosed herein.

DETAILED DESCRIPTION

Figure 1:
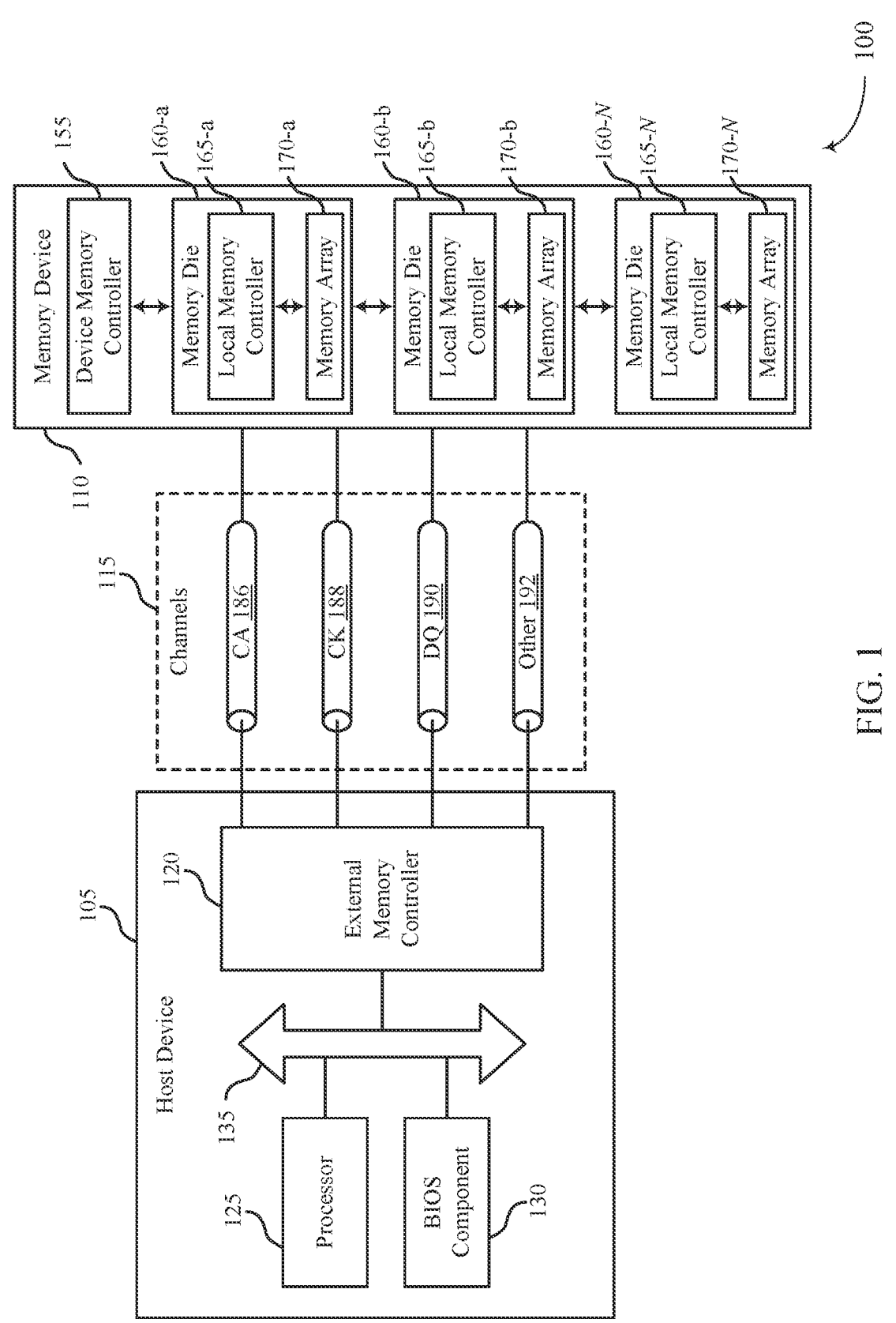
FIG. 1 illustrates an example of a system that supports techniques and devices to reduce bus cross talk in accordance with examples as disclosed herein.

Some memory systems may include a bus (e.g., a memory bus) having a large quantity of conductive lines (e.g., signal lines) which may transfer data from one portion of the memory system to another. The memory bus may drive each conductive line to one of multiple states, such as a high-state (e.g., high voltage, supply voltage) or a low-state (e.g., low voltage, ground). In some examples, a memory bus may include a sequence of drivers which may each include a pair of N-channel metal-oxide semiconductor (nMOS) transistors, and which may provide substantial power savings to the systems using the bus. However, because placing insulating or grounding material (e.g., shielding) between neighboring conductive lines may be impractical in some examples (e.g., due to size limitations), a conductive line in a memory bus may experience capacitive coupling with another conductive line, such as an adjacent conductive line. Accordingly, when both conductive lines drive a first state, such as a high-state, an additional voltage may be induced on each line, which may cause the first-state of a conductive line to become less reliable or unreliable (e.g., the high voltage of the conductive line may be above a reliability threshold). Accordingly, techniques to reduce such capacitive coupling, which may be referred to as cross-talk, may be desired.

As described herein, conductive lines (e.g., adjacent conductive lines) in a bus of a memory system may be capacitively coupled if both conductive lines are concurrently driven to a first state, such as a high-state. For example, the bus may include a logic circuit coupled between the conductive lines, and the logic circuit may selectively couple the conductive lines based on the voltage applied to each conductive line. In some examples, the logic circuit may include an input coupled with the control signals of the drivers associated with the conductive lines. Additionally, the logic circuit may include an output coupled with a gate of a transistor electrically positioned between the conductive lines. In some examples, if both control signals are concurrently high, the logic circuit may activate the transistor to couple the conductive lines, and if both control signals are not concurrently high, may deactivate the transistor to isolate the conductive lines. Such electrical coupling may reduce or eliminate the capacitive coupling between the two conductive lines when both are driven to a high state, which may result in increased reliability of signals in the conductive lines, among other advantages.

Features of the disclosure are initially described in the context of systems and dies as described with reference to FIG. 1. Features of the disclosure are described in the context control signal diagrams and systems as described with reference to FIGS. 2A, 2B, and 3. These and other features of the disclosure are further illustrated by and described with reference to an apparatus diagram and flowcharts that relate to techniques and devices to reduce bus cross talk as described with reference to FIGS. 4 through 5.

FIG. 1 illustrates an example of a system 100 that supports techniques and devices to reduce bus cross talk in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, data channels 190 may be operable to communicate information (e.g., data, control information) between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some cases conductive lines in a bus of a memory device may be arranged in a sequence such as by being distributed along a first direction, such as a horizontal direction, according to a pitch (e.g., a period, a distance between consecutive conductive lines). In some cases, adjacent conductive lines (e.g., consecutive conductive lines in the sequence, a conductive line and at least one of the nearest-neighbor conductive lines) in the bus of the memory device 110 may be electrically coupled if both conductive lines are concurrently driven to a high-state. For example, the bus may include a logic circuit coupled between the adjacent conductive lines, which may selectively couple the conductive lines based on the voltage applied to each conductive line. In some examples, the logic circuit may include an input coupled to the control signals of the drivers associated with the adjacent conductive lines. Additionally, the logic circuit may include an output coupled with a gate of a transistor electrically positioned between the conductive lines. If both control signals are concurrently high, the logic circuit may activate the transistor to couple the conductive lines, and may deactivate the transistor to isolate the conductive lines otherwise. Such electrical coupling may reduce or eliminate the capacitive coupling between the two conductive lines when both are driven to a high state, which may result in increased reliability of signals in the conductive lines.

In addition to applicability in memory systems as described herein, techniques and devices to reduce bus cross-talk may be generally implemented to improve the performance (including gaming and other high-speed or low-latency performance) of various electronic devices and systems. Some electronic device applications, including gaming and other high-performance applications, may be associated with relatively high processing requirements while also benefitting from relatively quick response times to improve user experience. As such, increasing processing speed, decreasing response times, or otherwise improving the performance of electronic devices may be desirable. Implementing the techniques described herein may improve the performance of electronic devices by allowing for higher performing and higher density busses (e.g., finer pitched busses) without exceeding reliability thresholds of drivers and receivers of bus, which may decrease processing or latency times, improve response times, or otherwise improve user experience, among other benefits.

Figure 2A:
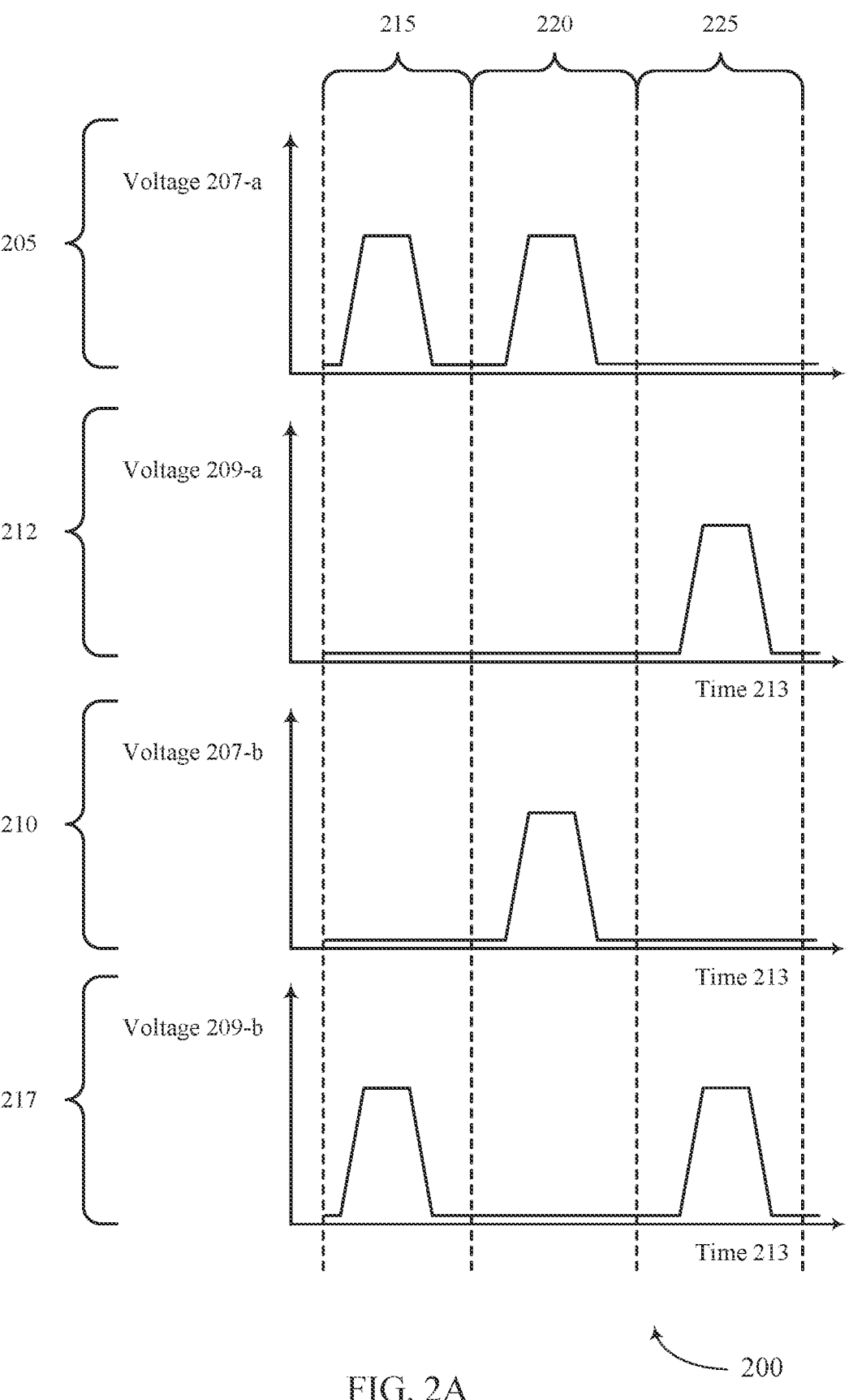
FIG. 2A illustrates examples of control signal diagrams that supports techniques and devices to reduce bus cross talk in accordance with examples as disclosed herein.
Figure 2B:
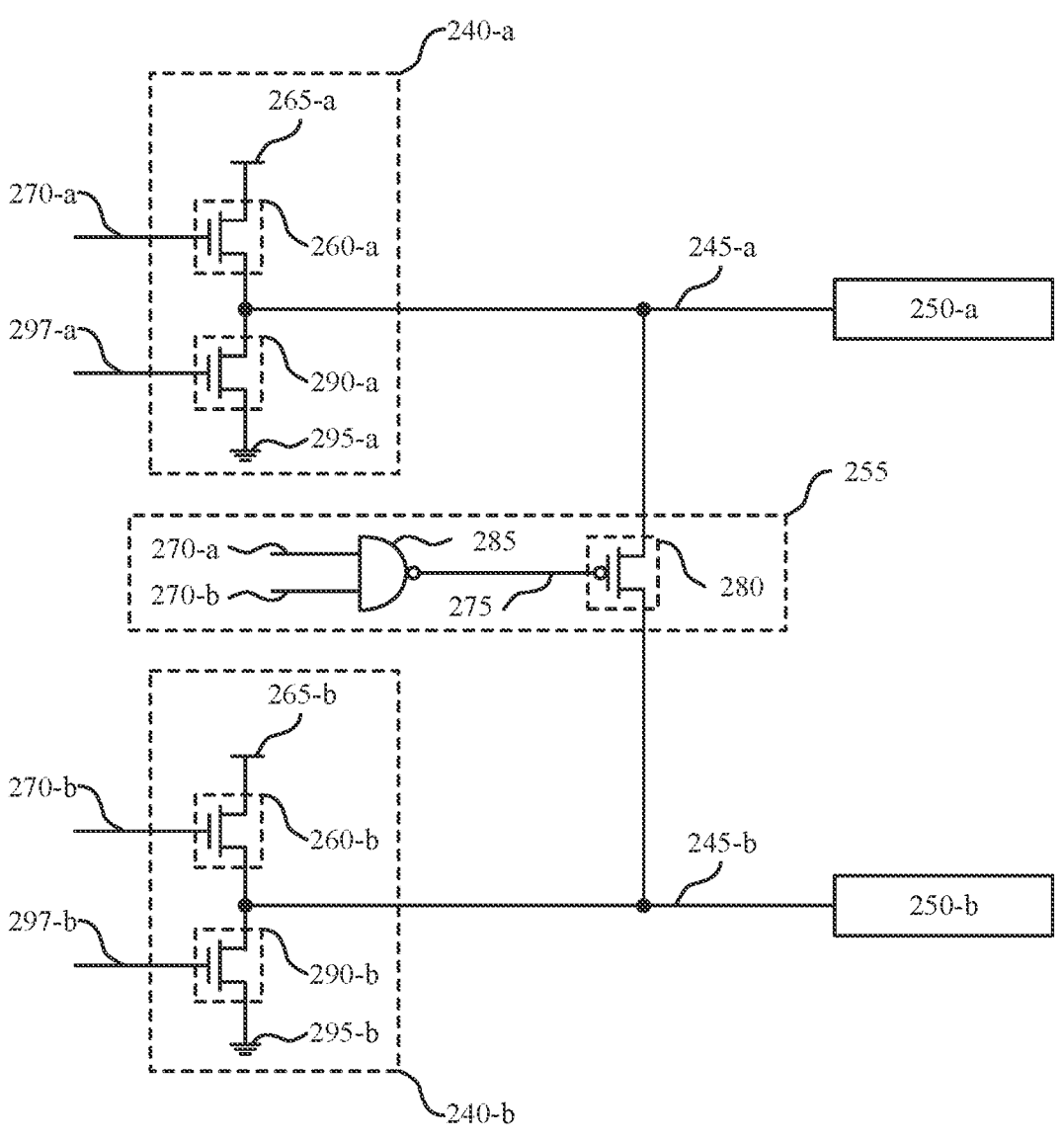
FIG. 2B illustrates an example of a system that supports techniques and devices to reduce bus cross talk in accordance with examples as disclosed herein.

FIGS. 2A and 2B illustrates an example of a signal diagram 200 and a system 201, respectively, that support techniques and devices to reduce bus cross talk in accordance with examples as disclosed herein. The system 201 may be an example of or may illustrate aspects of a data bus, such as a data bus used to communicate signals and data between components of a memory device 110 (e.g., between a device memory controller 155 and one or more memory dies 160, between a local memory controller 165 and a memory array 170). For example, the system 201 may include one or more drivers 240 (e.g., the driver 240-a and the driver 240-b) configured to transmit signals to one or more receivers 250 (e.g., the receiver 250-a and the receiver 250-b) over one or more conductive lines 245 (e.g., the conductive line 245-a and the conductive line 245-b).

A driver 240 may be configured to sequentially transmit multiple levels of signals. For example, drivers 240 illustrated in FIG. 2B may be configured to transmit, at a particular duration, a first signal corresponding to a high voltage (e.g., a supply voltage) or a second signal corresponding to a low voltage (e.g., a ground voltage, a virtual ground voltage, a zero voltage). To support providing multiple voltages, a driver 240 may include a set of transistors to selectively couple the conductive line 245 associated with the driver 240 with a voltage source.

For example, a driver 240 may include a transistor 260 having a first terminal coupled with the conductive line 245 and a second terminal coupled with the supply voltage node 265. That is, the transistor 260 may be positioned electrically between the conductive line 245 and a supply voltage node 265. The transistor 260 may include a gate coupled with a control signal node 270, which may activate the transistor 260 to couple the supply voltage node 265 with the conductive line 245, and may deactivate the transistor 260 to isolate the supply voltage node 265 from the conductive line 245 (e.g., the transistor 260 may selectively couple the supply voltage node 265 with the conductive line 245). Additionally, the driver 240 may include a transistor 290 between the conductive line 245 and a ground voltage node 295. The transistor 290 may include a gate coupled with a control signal node 297, which may activate the transistor 290 to couple the ground voltage node 295 with the conductive line 245, and may deactivate the transistor 290 to isolate the ground voltage node 295 from the conductive line 245 (e.g., the transistor 290 may selectively couple the ground voltage node 295 with the conductive line 245).

In some cases, the transistor 260 and the transistor 290 of a driver 240 may both be examples of N-type metal-oxide semiconductor (nMOS) transistors, and the driver 240 may be referred to as an N-over-N driver. In other cases, the transistor 260 and the transistor 290 of a driver 240 may one or both be examples of other transistors. Accordingly, if the transistor 260 is activated (e.g., by applying a high control signal to the gate of the transistor 260), the transistor 260 may transmit a first voltage over the conductive line 245. Because the transistor 260 may be an nMOS transistor, the first voltage may be less than the voltage of the supply voltage node 265 (e.g., the voltage of the supply voltage node 265 may be reduced by the threshold voltage of the transistor 260). In some cases, such as within busses having many channels (e.g., 64 channels, 128 channels), using an N-over-N driver within a bus may allow for limited-swing signaling, which may reduce switching current of the drivers 240, and thus provide power savings for the memory system.

In some examples, the conductive line 245-a and the conductive line 245-b may be capacitively coupled. For example, the conductive line 245-a may be adjacent to (e.g., within a threshold distance, adjacent in a sequence of conductive lines 245) the conductive line 245-b, such that a first voltage applied to the conductive line 245-a may induce a second voltage on the conductive line 245-b (e.g., due to parasitic capacitance). In some cases, insulating or grounding material (e.g., shielding) between conductive lines 245 may not be feasible (e.g., due to space considerations), which may expose the conductive lines 245 to capacitive coupling. For example, if the conductive line 245-a and the conductive line 245-b each transmit a high voltage, capacitive coupling may increase the voltage on each conductive line 245, which may cause the voltage to exceed a reliable operating range of the drivers 240, the receivers 250, or both. To mitigate capacitive coupling, the system 201 may selectively couple the conductive line 245-a with the conductive line 245-b.

For example, the logic circuit 255 may be configured to selectively couple the conductive line 245-a with the conductive line 245-b. In some cases, the logic circuit 255 may couple the conductive line 245-a with the conductive line 245-b if the driver 240-a and the driver 240-b concurrently transmit a high voltage (e.g., the first signal). For example, the logic circuit 255 may include a logical gate 285, such as a not-AND (NAND) gate, having a first input coupled with the control signal node 270-a, a second input coupled with the control signal node 270-b, and an output 275 coupled with the gate of a transistor 280. The transistor 280 may be a P-type metal-oxide semiconductor (pMOS) transistor, and may be electrically positioned between the conductive line 245-a and the conductive line 245-b. Accordingly, the transistor 280 may selectively couple (e.g., short) the conductive line 245-a with the conductive line 245-b in response to an output of the logical gate 285.

The drivers 240 may be controlled via one or more control signals communicated over the control signal nodes 270 and the control signal nodes 297. Such control signals may be illustrated in a control signal diagram, such as the control signal diagrams 205 and 210. For example, the control signal diagram 205 may illustrate a control signal 207-a transmitted over a signal node 270-a to a gate of the transistor 260-a over time 213, the control signal diagram 210 may illustrate a control signal 207-b transmitted over a signal node 270-b to a gate of the transistor 260-b over time 213, the control signal diagram 212 may illustrate a control signal 209-a transmitted over a signal node 297-a to a gate of the transistor 290-a over time 213, and the control signal diagram 217 may illustrate a control signal 209-b transmitted over a signal node 297-b to a gate of the transistor 290-b over time 213. Additionally, the signal node 270-a may transmit the control signal 207-a to the first input of the logical gate 285, and the signal node 270-b may transmit the control signal 207-b to the second input of the logical gate 285.

By way of example, the control signal diagrams 205, 212, 210, and 217 may include a duration 215 in which the signal node 270-a may transmit a high control signal, while the signal node 270-b may transmit a low control signal. In some examples, the signal node 297-a may transmit a low control signal, and the signal node 297-b may transmit a high control signal during the duration 215. Accordingly, the driver 240-a may transmit the first signal over the conductive line 245-a, and the driver 240-b may transmit the second signal over the conductive line 245-b. Additionally, the logical gate 285 may output a high voltage to deactivate the transistor 280, which may isolate the conductive line 245-a from the conductive line 245-b.

The control signal diagrams 205, 212, 210, and 217 may include a duration 220 in which the signal node 270-a may transmit a high control signal, and the signal node 270-b may transmit a high control signal which at least partially overlaps in time with the signal node 270-a transmitting the high control signal (e.g., the signal node 270-a and the signal node 270-b may concurrently transmit the high control signal). In some examples, the signal node 297-a and the signal node 297-b may both transmit a low control signal during the duration 220. Accordingly, the driver 240-a may transmit the first signal over the conductive line 245-a, and the driver 240-b may transmit the first signal over the conductive line 245-b, which may at least partially overlap in time with the driver 240-a transmitting the first signal over the conductive line 245-a. Additionally, because the logical gate 285 may receive signaling from the signal node 270-a and the signal node 270-b, the logical gate 285 may output a low voltage to active the transistor 280, which may couple the conductive line 245-a with the conductive line 245-b.

The control signal diagrams 205 and 210 may include a duration 225 in which both the signal node 270-a and the signal node 270-b may transmit a low control signal. In some examples, the signal node 297-a and the signal node 297-b may both transmit a high control signal during the duration 225. Accordingly, the driver 240-a may transmit the second signal over the conductive line 245-a, and the driver 240-b may transmit the second signal over the conductive line 245-b. Additionally, the logical gate 285 may output a high voltage to deactivate the transistor 280, which may isolate the conductive line 245-a from the conductive line 245-b.

Figure 3:
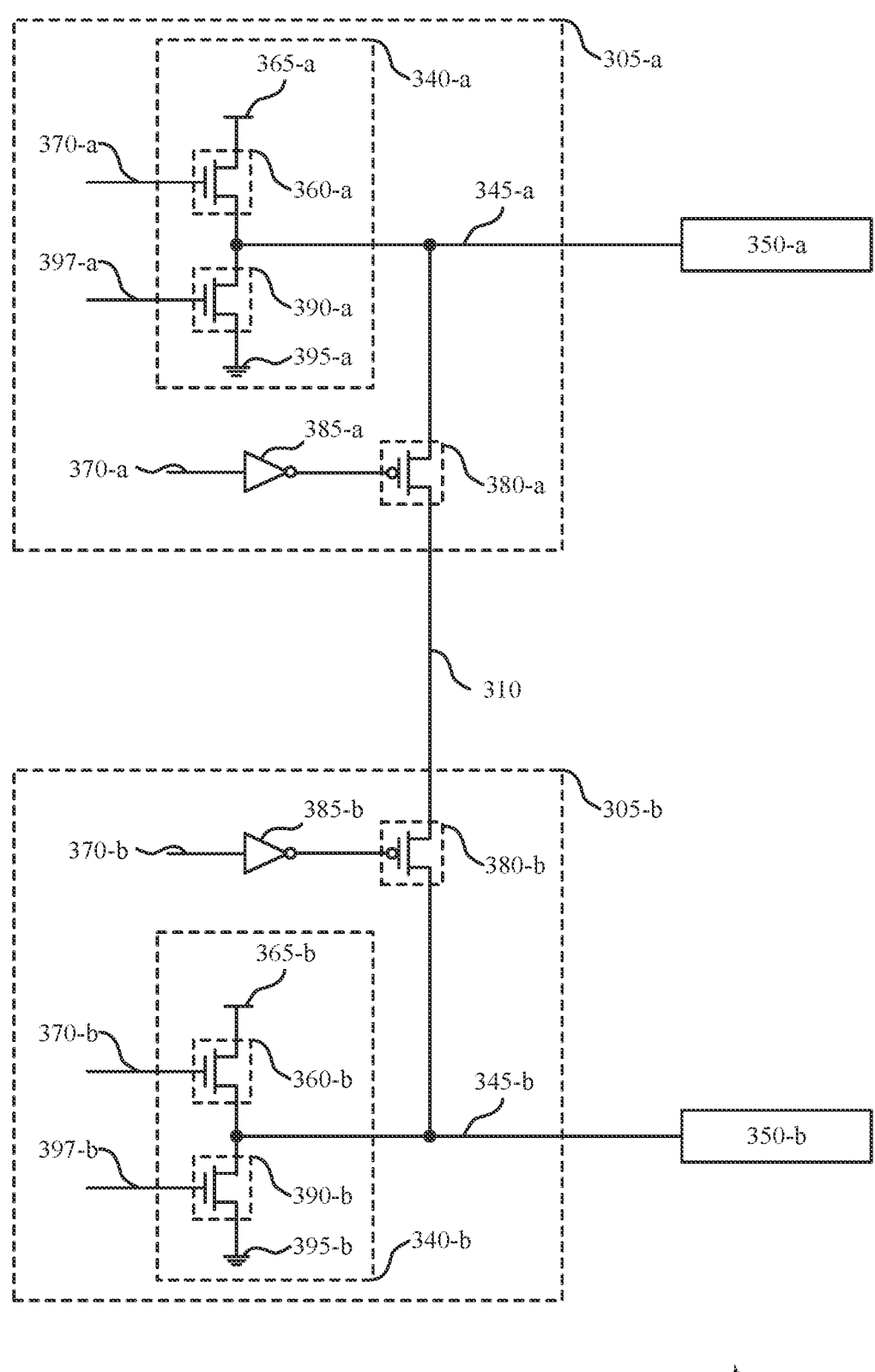
FIG. 3 illustrates an example of a system that supports techniques and devices to reduce bus cross talk in accordance with examples as disclosed herein.

FIG. 3 illustrates an example of a system 300 that supports techniques and devices to reduce bus cross talk in accordance with examples as disclosed herein. The system 300 may be an example of or may illustrate aspects of a data bus, such as a data bus used to communicate signals and data between components of a memory device 110 (e.g., between a device memory controller 155 and one or more memory dies 160, between a local memory controller 165 and a memory array 170). In some examples, the system 300 may include a set of repeated elements, such as a sequence (e.g., spatial sequence) of identical or substantially identical unit cells, in which each component (e.g., logical gates, active transistors) of the system 300 is associated with a particular unit cell. Such an architecture may simplify design, manufacture, or both, which may reduce manufacturing errors, reduce costs associated with manufacturing, simplify modifications of the system 300, or a combination thereof.

For example, the system 300 may include one or more circuits 305 (e.g., the circuit 305-a and the circuit 305-b, which may be examples of driver cells) arranged in a sequence. The circuits 305 may include one or more drivers 340 (e.g., the driver 340-a and the driver 340-b) configured to transmit signals to one or more receivers 350 (e.g., the receiver 350-a and the receiver 350-b) over one or more conductive lines 345 (e.g., the conductive line 345-a and the conductive line 345-b), which may each be examples of the corresponding components as described with reference to FIG. 2B.

The drivers 340 and the conductive lines 345 may function similarly to drivers 240 and the conductive lines 245. For example, a driver 340 may include a transistor 360 having a gate coupled with a control signal node 370, and a transistor 390 having a gate coupled with a control signal node 397. Additionally, the driver 340 may have an outputs coupled with an associated conductive line 345. The transistor 360 may be electrically positioned between and have terminals coupled with a supply voltage node 365 and the conductive line 345, and the transistor 390 may be electrically positioned between and have terminals coupled with the ground voltage node 395 and the conductive line 345. Control signals (e.g., as illustrated in control signal diagrams 205 and 210, as described with reference to FIG. 2A) transmitted over the control signal nodes 370 and 397 may selectively activate the transistor 360, the transistor 390, or both, which may couple the associated conductive line 345 with a supply node 365 or a ground node 395, respectively. In some examples, the transistors 360 and the transistors 390 may be nMOS transistors, and accordingly the driver 340 may be an example of an N-over-N driver.

A circuit 305 may include one or more logical components (e.g., logical gates, active transistors) configured to selectively couple the conductive line 345-a with the conductive line 345-b. For example, the circuit 305 may include an inverter 385 and transistors a 380. The inverter 385 may include an input coupled with a control signal node 370, and may include an output coupled with a gate of the transistor 380. Additionally, a terminal of the transistor 380 may be coupled with the conductive line 345. Accordingly, a high signal on the input to the inverter 385 may cause the inverter 385 to output a low signal, which may activate the transistor 380. Alternatively, a low signal on the input to the inverter 385 may cause the inverter 385 to output a high signal, which may deactivate the transistor 380.

Adjacent circuits 305 (e.g., adjacent within the sequence, circuits within a threshold distance of each other) may include conductive lines 345 which are selectively coupled together. For example, a connecting wire 310 may be positioned between the circuit 305-a and the circuit 305-b. The connecting wire 310 may couple a terminal of the transistor 380-a with a terminal of the transistor 380-b. Accordingly, if both the transistor 380-a and the transistor 380-b are activated concurrently, the conductive line 345-a and the conductive line 345-b may be coupled (e.g., shorted) via the transistor 380-a, the transistor 380-b, and the connecting wire 310. Alternatively, if the transistor 380-a, the transistor 380-b, or both are deactivated, the conductive line 345-a may be isolated (e.g., electrically isolated) from the conductive line 345-b.

By way of example, as part of operating the system 300, the signal node 370-a may transmit a high control signal, and the signal node 370-b may transmit a high control signal which at least partially overlaps in time with the signal node 370-a transmitting the high control signal (e.g., the signal node 370-a and the signal node 370-b may concurrently transmit the high control signal). Accordingly, the driver 340-a may transmit a high voltage (e.g., a first signal) over the conductive line 345-a, and the driver 340-b may transmit the first signal over the conductive line 345-b, which may at least partially overlap in time with the driver 340-a transmitting the first signal over the conductive line 345-a. Additionally, because the inverter 385-a may receive signaling from the control signal node 370-a and the inverter 385-b may receive signaling from the control signal node 370-b, the control signal node 370-a may activate the transistor 380-a and the control signal node 370-b may activate the transistor 380-b, which may couple the conductive line 345-a with the conductive line 345-b and accordingly reduce or remove capacitance between the conductive line 345-a and the conductive line 345-b.

Additionally, as part of operating the system 300, the signal node 370-a may transmit a high control signal, and the signal node 370-b may transmit a low control signal which at least partially overlaps in time with the signal node 370-a transmitting the high control signal. Accordingly, the driver 340-a may transmit the first signal over the conductive line 345-a, and the driver 340-b may transmit a low voltage (e.g., a second signal) over the conductive line 345-b. Additionally, because the inverter 385-a may receive signaling from the control signal node 370-a and the inverter 385-b may receive signaling from the control signal node 370-*b*, the control signal node 370-*a* may activate the transistor 380-*a* and the signal node 370-*b* may deactivate the transistor 380-*b*, which may isolate the conductive line 345-*a* from the conductive line 345-*b*.

Additionally, as part of operating the system 300, the signal node 370-*a* may transmit a low control signal, and the signal node 370-*b* may transmit a low control signal which at least partially overlaps in time with the signal node 370-*a* transmitting the low control signal. Accordingly, the driver 340-*a* may transmit the second signal over the conductive line 345-*a*, and the driver 340-*b* may transmit the second signal over the conductive line 345-*b*. Additionally, because the inverter 385-*a* may receive signaling from the control signal node 370-*a* and the inverter 385-*b* may receive signaling from the control signal node 370-*b*, the control signal node 370-*a* may deactivate the transistor 380-*a* and the signal node 370-*b* may deactivate the transistor 380-*b*, which may isolate the conductive line 345-*a* from conductive line 345-*b*.

Figure 4:
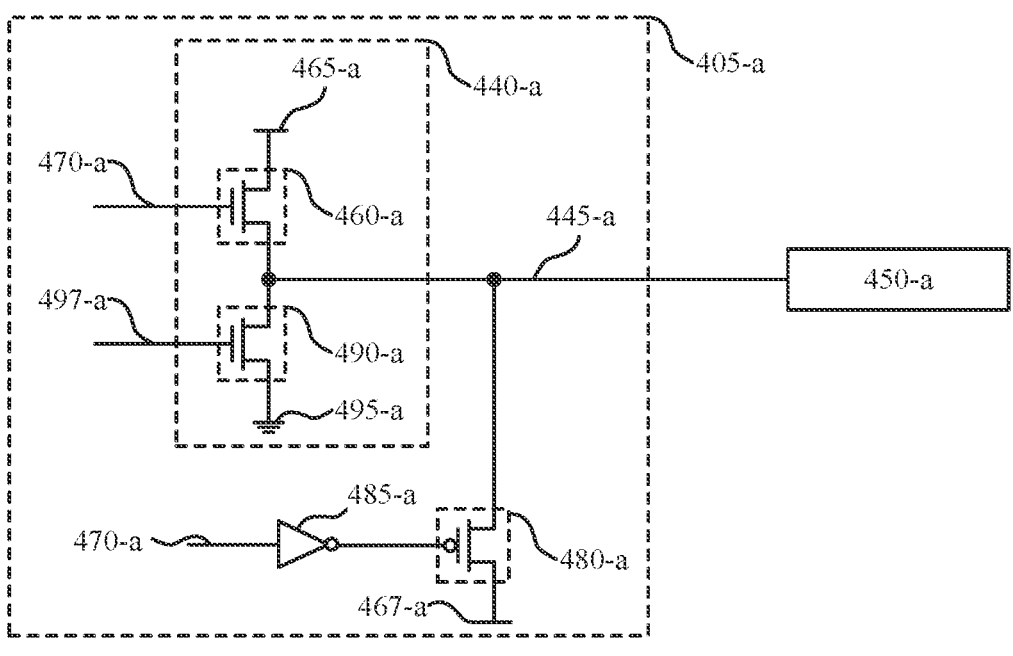
FIG. 4 illustrates an example of a system that supports techniques and devices to reduce bus cross talk in accordance with examples as disclosed herein.
Figure 4:
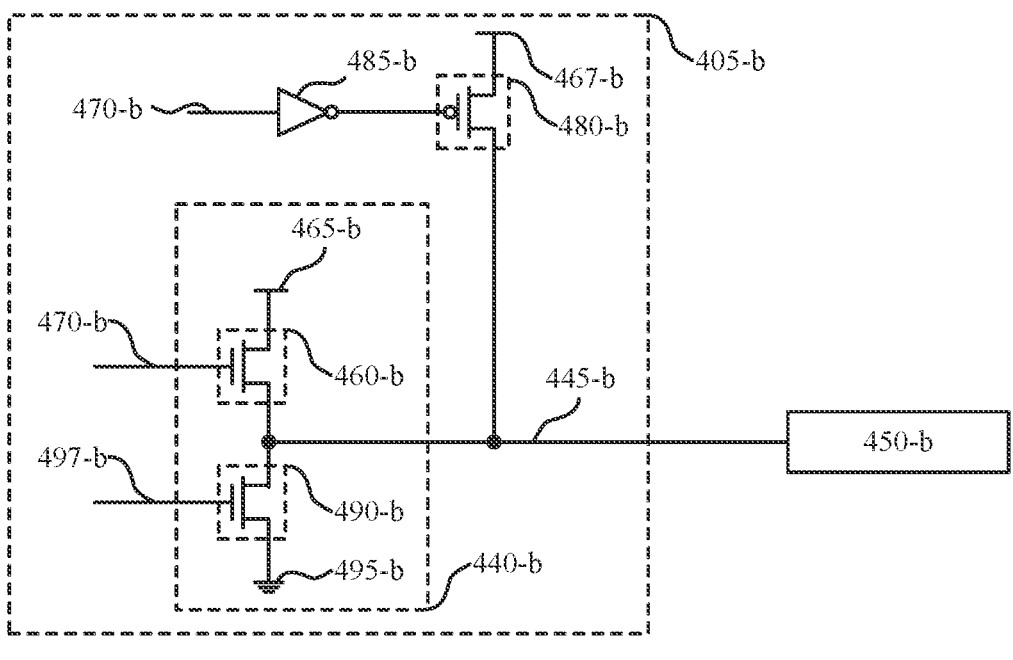

FIG. 4 illustrates an example of a system 400 that supports techniques and devices to reduce bus cross talk in accordance with examples as disclosed herein. The system 400 may be an example of or may illustrate aspects of a data bus, such as a data bus used to communicate signals and data between components of a memory device 110 (e.g., between a device memory controller 155 and one or more memory dies 160, between a local memory controller 165 and a memory array 170). In some examples, the system 400 may include a set of repeated elements, such as a sequence (e.g., spatial sequence) of identical or substantially identical unit cells, in which each component (e.g., logical gates, active transistors) of the system 400 is associated with a particular unit cell. Such an architecture may simplify design, manufacture, or both, which may reduce manufacturing errors, reduce costs associated with manufacturing, simplify modifications of the system 400, or a combination thereof.

For example, the system 400 may include one or more circuits 405 (e.g., the circuit 405-*a* and the circuit 405-*b*, which may be examples of driver cells) arranged in a sequence. The circuits 405 may include one or more drivers 440 (e.g., the driver 440-*a* and the driver 440-*b*) configured to transmit signals to one or more receivers 450 (e.g., the receiver 450-*a* and the receiver 450-*b*) over one or more conductive lines 445 (e.g., the conductive line 445-*a* and the conductive line 445-*b*), which may each be examples of the corresponding components as described with reference to FIG. 2B.

The drivers 440 and the conductive lines 445 may function similarly to drivers 240 and the conductive lines 245. For example, a driver 440 may include a transistor 460 having a gate coupled with a control signal node 470, and a transistor 490 having a gate coupled with a control signal node 497. Additionally, the driver 440 may have an output coupled with an associated conductive line 445. The transistor 460 may be electrically positioned between and have terminals coupled with a supply voltage node 465 and the conductive line 445, and the transistor 490 may be electrically positioned between and have terminals coupled with the ground voltage node 495 and the conductive line 445. Control signals (e.g., as illustrated in control signal diagrams 205 and 210, as described with reference to FIG. 2A) transmitted over the control signal nodes 470 and 497 may selectively activate the transistor 460, the transistor 490, or both, which may couple the associated conductive line 445 with a supply node 465 or a ground node 495, respectively. In some examples, the transistors 460 and the transistors 490 may be nMOS transistors, and accordingly the driver 440 may be an example of an N-over-N driver.

A circuit 405 may include one or more logical components (e.g., logical gates, active transistors) configured act as a protection against overvoltage, without acting as a driver. For example, the circuit 405 may include an inverter 485 and a transistors 480. The inverter 485 may include an input coupled with a control signal node 470, and may include an output coupled with a gate of the transistor 480. Additionally, a terminal of the transistor 480 may be coupled with the conductive line 445. Accordingly, a high signal on the input to the inverter 485 may cause the inverter 485 to output a low signal, which may activate the transistor 480. Alternatively, a low signal on the input to the inverter 485 may cause the inverter 485 to output a high signal, which may deactivate the transistor 480. A second terminal of the transistor 480 may be coupled with a supply node 467, and a size of the transistor 480 may be sufficiently small, such that the transistor 480 may act as a protection against overvoltage, without acting as a driver.

By way of example, as part of operating the system 400, the signal node 470-*a* may transmit a high control signal, and the signal node 470-*b* may transmit a high control signal which at least partially overlaps in time with the signal node 470-*a* transmitting the high control signal (e.g., the signal node 470-*a* and the signal node 470-*b* may concurrently transmit the high control signal). Accordingly, the driver 440-*a* may transmit a high voltage (e.g., a first signal) over the conductive line 445-*a*, and the driver 440-*b* may transmit the first signal over the conductive line 445-*b*, which may at least partially overlap in time with the driver 440-*a* transmitting the first signal over the conductive line 445-*a*. Additionally, because the inverter 485-*a* may receive signaling from the control signal node 470-*a* and the inverter 485-*b* may receive signaling from the control signal node 470-*b*, the control signal node 470-*a* may activate the transistor 480-*a* and the control signal node 470-*b* may activate the transistor 480-*b*, which may couple the conductive line 445-*a* with the supply node 467-*a* and may couple the conductive line 445-*b* with the supply node 467-*b*.

Additionally, as part of operating the system 400, the signal node 470-*a* may transmit a high control signal, and the signal node 470-*b* may transmit a low control signal which at least partially overlaps in time with the signal node 470-*a* transmitting the high control signal. Accordingly, the driver 440-*a* may transmit the first signal over the conductive line 445-*a*, and the driver 440-*b* may transmit a low voltage (e.g., a second signal) over the conductive line 445-*b*. Additionally, because the inverter 485-*a* may receive signaling from the control signal node 470-*a* and the inverter 485-*b* may receive signaling from the control signal node 470-*b*, the control signal node 470-*a* may activate the transistor 480-*a* and the signal node 470-*b* may deactivate the transistor 480-*b*.

Additionally, as part of operating the system 400, the signal node 470-*a* may transmit a low control signal, and the signal node 470-*b* may transmit a low control signal which at least partially overlaps in time with the signal node 470-*a* transmitting the low control signal. Accordingly, the driver 440-*a* may transmit the second signal over the conductive line 445-*a*, and the driver 440-*b* may transmit the second signal over the conductive line 445-*b*. Additionally, because the inverter 485-*a* may receive signaling from the control signal node 470-*a* and the inverter 485-*b* may receive signaling from the control signal node 470-*b*, the control signal node 470-*a* may deactivate the transistor 480-*a* and the signal node 470-*b* may deactivate the transistor 480-*b*.

Figure 5:
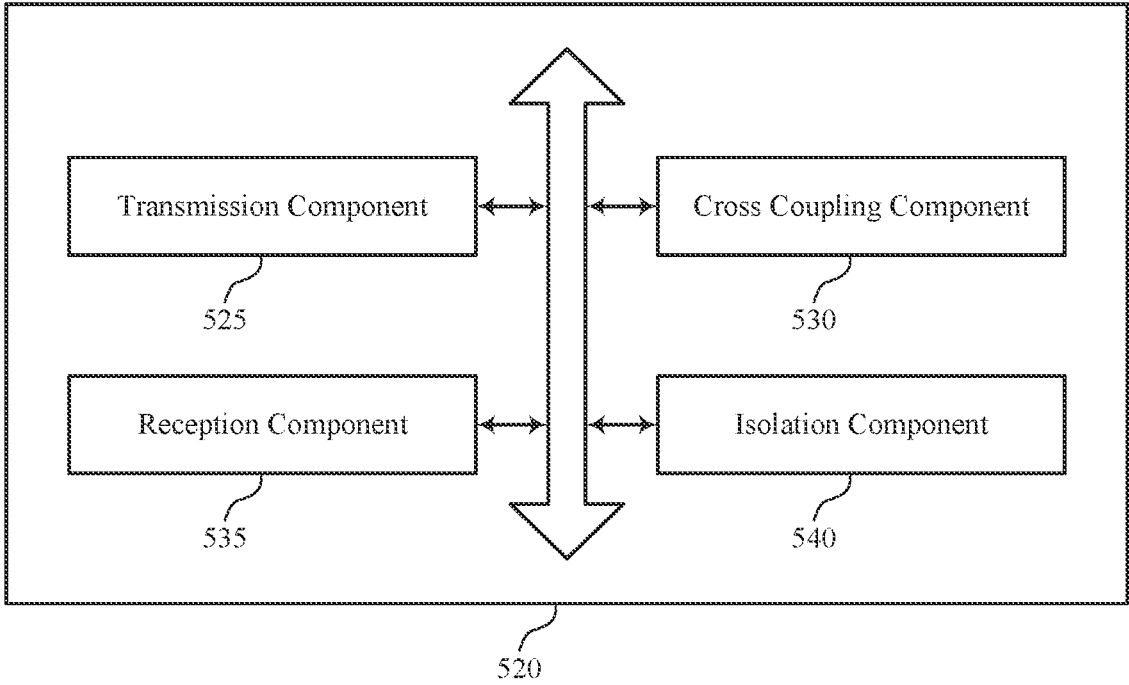
FIG. 5 illustrates a block diagram of a memory system that supports techniques and devices to reduce bus cross talk in accordance with examples as disclosed herein.

FIG. 5 illustrates a block diagram 500 of a memory system 520 that supports techniques and devices to reduce bus cross talk in accordance with examples as disclosed herein. The memory system 520 may be an example of aspects of a memory system as described with reference to FIGS. 1 through 4. The memory system 520, or various components thereof, may be an example of means for performing various aspects of techniques and devices to reduce bus cross talk as described herein. For example, the memory system 520 may include a transmission component 525, a cross coupling component 530, a reception component 535, an isolation component 540, or any combination thereof. Each of these components may communicate, directly or indirectly, with one another (e.g., via one or more buses).

The transmission component 525 may be configured as or otherwise support a means for transmitting, based at least in part on a first control signal, a voltage over a first conductive line of a data bus associated with a memory array. In some examples, the transmission component 525 may be configured as or otherwise support a means for transmitting, based at least in part on a second control signal, the voltage over a second conductive line of the data bus, where transmitting the voltage over the first conductive line at least partially overlaps in time with transmitting the voltage over the second conductive line. The cross coupling component 530 may be configured as or otherwise support a means for coupling the first conductive line with the second conductive line based at least in part on the first control signal and the second control signal.

In some examples, the reception component 535 may be configured as or otherwise support a means for receiving the first control signal at a first driver coupled with the first conductive line. In some examples, the reception component 535 may be configured as or otherwise support a means for receiving the second control signal at a second driver coupled with the second conductive line, where receiving the first control signal at least partially overlaps in time with receiving the second control signal.

In some examples, the first driver includes a first transistor configured to selectively couple the first conductive line with a first supply node based at least in part on receiving the first control signal and the second driver includes a second transistor configured to selectively couple the second conductive line with a second supply node based at least in part on receiving the second control signal.

In some examples, the reception component 535 may be configured as or otherwise support a means for receiving the first control signal and receiving the second control signal at a logic circuit configured to couple the first conductive line with the second conductive line based at least in part on receiving the first control signal at least partially overlapping in time with receiving the second control signal.

In some examples, the transmission component 525 may be configured as or otherwise support a means for transmitting, based at least in part on a third control signal, the voltage over the first conductive line. In some examples, the transmission component 525 may be configured as or otherwise support a means for transmitting, based at least in part on a fourth control signal, a second voltage different from the voltage over the second conductive line of the data bus, where transmitting the voltage over the first conductive line at least partially overlaps in time with transmitting the second voltage over the second conductive line. In some examples, the isolation component 540 may be configured as or otherwise support a means for isolating the first conductive line from the second conductive line based at least in part on the third control signal and the fourth control signal.

In some examples, the transmission component 525 may be configured as or otherwise support a means for transmitting, based at least in part on a third control signal, a second voltage over the first conductive line. In some examples, the transmission component 525 may be configured as or otherwise support a means for transmitting, based at least in part on a fourth control signal, the second voltage over the second conductive line of the data bus, where transmitting the second voltage over the first conductive line at least partially overlaps in time with transmitting the second voltage over the second conductive line. In some examples, the isolation component 540 may be configured as or otherwise support a means for isolating the first conductive line from the second conductive line based at least in part on the third control signal and the fourth control signal.

FIG. 6 illustrates a flowchart showing a method 600 that supports techniques and devices to reduce bus cross talk in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include transmitting, based at least in part on a first control signal, a voltage over a first conductive line of a data bus associated with a memory array. The operations of 605 may be performed in accordance with examples as disclosed herein. In some examples, aspects of the operations of 605 may be performed by a transmission component 525 as described with reference to FIG. 5.

At 610, the method may include transmitting, based at least in part on a second control signal, the voltage over a second conductive line of the data bus, where transmitting the voltage over the first conductive line at least partially overlaps in time with transmitting the voltage over the second conductive line. The operations of 610 may be performed in accordance with examples as disclosed herein. In some examples, aspects of the operations of 610 may be performed by a transmission component 525 as described with reference to FIG. 5.

At 615, the method may include coupling the first conductive line with the second conductive line based at least in part on the first control signal and the second control signal. The operations of 615 may be performed in accordance with examples as disclosed herein. In some examples, aspects of the operations of 615 may be performed by a cross coupling component 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for transmitting, based at least in part on a first control signal, a voltage over a first conductive line of a data bus associated with a memory array; transmitting, based at least in part on a second control signal, the voltage over a second conductive line of the data bus, where transmitting the voltage over the first conductive line at least partially overlaps in time with transmitting the voltage over the second conductive line; and coupling the first conductive line with the second conductive line based at least in part on the first control signal and the second control signal.

Aspect 2: The method, apparatus, or non-transitory computer-readable medium of aspect 1, further including operations, features, circuitry, logic, means, or instructions, or any combination thereof for receiving the first control signal at a first driver coupled with the first conductive line and receiving the second control signal at a second driver coupled with the second conductive line, where receiving the first control signal at least partially overlaps in time with receiving the second control signal.

Aspect 3: The method, apparatus, or non-transitory computer-readable medium of aspect 2, where the first driver includes a first transistor configured to selectively couple the first conductive line with a first supply node based at least in part on receiving the first control signal and the second driver includes a second transistor configured to selectively couple the second conductive line with a second supply node based at least in part on receiving the second control signal.

Aspect 4: The method, apparatus, or non-transitory computer-readable medium of any of aspects 1 through 3, further including operations, features, circuitry, logic, means, or instructions, or any combination thereof for receiving the first control signal and receiving the second control signal at a logic circuit configured to couple the first conductive line with the second conductive line based at least in part on receiving the first control signal at least partially overlapping in time with receiving the second control signal.

Aspect 5: The method, apparatus, or non-transitory computer-readable medium of any of aspects 1 through 4, further including operations, features, circuitry, logic, means, or instructions, or any combination thereof for transmitting, based at least in part on a third control signal, the voltage over the first conductive line; transmitting, based at least in part on a fourth control signal, a second voltage different from the voltage over the second conductive line of the data bus, where transmitting the voltage over the first conductive line at least partially overlaps in time with transmitting the second voltage over the second conductive line; and isolating the first conductive line from the second conductive line based at least in part on the third control signal and the fourth control signal.

Aspect 6: The method, apparatus, or non-transitory computer-readable medium of any of aspects 1 through 5, further including operations, features, circuitry, logic, means, or instructions, or any combination thereof for transmitting, based at least in part on a third control signal, a second voltage over the first conductive line; transmitting, based at least in part on a fourth control signal, the second voltage over the second conductive line of the data bus, where transmitting the second voltage over the first conductive line at least partially overlaps in time with transmitting the second voltage over the second conductive line; and isolating the first conductive line from the second conductive line based at least in part on the third control signal and the fourth control signal.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 7: An apparatus, including: a first driver coupled with a first conductive line of a data bus associated with a memory array; a second driver coupled with a second conductive line of the data bus; and a logic circuit configured to selectively couple the first conductive line with the second conductive line based at least in part on transmitting a voltage from the first driver to the first conductive line at least partially overlapping in time with transmitting the voltage from the second driver to the second conductive line.

Aspect 8: The apparatus of aspect 7, where: the first driver includes a first transistor configured to selectively couple the first conductive line with a first supply node based at least in part on a first control signal; and the second driver includes a second transistor configured to selectively couple the second conductive line with a second supply node based at least in part on a second control signal.

Aspect 9: The apparatus of aspect 8, where the logic circuit includes: an input configured to receive the first control signal and the second control signal; and an output coupled with a third transistor positioned electrically between the first conductive line and the second conductive line, where the logic circuit is configured to activate the third transistor based at least in part on receiving the first control signal at least partially overlapping in time with receiving the second control signal.

Aspect 10: The apparatus of aspect 9, where the third transistor is a pMOS transistor.

Aspect 11: The apparatus of any of aspects 9 through 10, where the logic circuit includes a not-and (NAND) gate.

Aspect 12: The apparatus of any of aspects 8 through 11, where: the first driver further includes a third transistor configured to selectively couple the first conductive line with a first ground node based at least in part on a third control signal; and the second driver further includes a fourth transistor configured to selectively couple the second conductive line with a second ground node based at least in part on a fourth control signal.

Aspect 13: The apparatus of aspect 12, where the first transistor, the second transistor, the third transistor, and the fourth transistor is each an nMOS transistor.

Aspect 14: The apparatus of any of aspects 8 through 13, where a second voltage of the first supply node is greater than the voltage.

Aspect 15: The apparatus of any of aspects 7 through 14, where the logic circuit is further configured to isolate the first conductive line from the second conductive line based at least in part on transmitting a second voltage from the first driver to the first conductive line at least partially overlapping in time with transmitting a third voltage different from the second voltage from the second driver to the second conductive line.

Aspect 16: The apparatus of any of aspects 7 through 15, where the logic circuit is further configured to isolate the first conductive line from the second conductive line based at least in part on transmitting a second voltage different from the voltage from the first driver to the first conductive line at least partially overlapping in time with transmitting the second voltage from the second driver to the second conductive line.

An apparatus is described. The following provides an overview of aspects of the apparatus as described herein:

Aspect 17: An apparatus, including: a first circuit including a first driver and a first transistor, the first driver having an input coupled with a first signal node and an output coupled with a first conductive line of a data bus associated with a memory array, and the first transistor having a gate coupled with the first signal node; and a second circuit including a second driver and a second transistor coupled with the first transistor, the second driver having an input coupled with a second signal node and an output coupled with a second conductive line of the data bus, and the second transistor having a gate coupled with the second signal node and electrically positioned electrically between the first conductive line and the second conductive line.

Aspect 18: The apparatus of aspect 17, where: the first circuit further includes a first inverter having an input coupled with the first signal node and an output coupled with the gate of the first transistor; and the second circuit further includes a second inverter having an input coupled with the second signal node and an output coupled with the gate of the second transistor.

Aspect 19: The apparatus of any of aspects 17 through 18, where: the first driver includes a third transistor having a gate coupled with the first signal node and positioned electrically between a first supply node and the first conductive line; and the second driver includes a fourth transistor having a gate coupled with the second signal node and positioned electrically between a second supply node and the second conductive line.

Aspect 20: The apparatus of aspect 19, where: a first terminal of the third transistor is coupled with the first supply node and a second terminal of the third transistor is coupled with the first conductive line; and a third terminal of the fourth transistor is coupled with the second supply node and a fourth terminal of the fourth transistor is coupled with the second conductive line.

Aspect 21: The apparatus of any of aspects 19 through 20, where: the first driver includes a fifth transistor having a gate coupled with a third signal node and positioned electrically between a first ground node and the first conductive line; and the second driver includes a sixth transistor having a gate coupled with a fourth signal node and positioned electrically between a second ground node and the second conductive line.

Aspect 22: The apparatus of aspect 21, where: a first terminal of the fifth transistor is coupled with the first ground node and a second terminal of the fifth transistor is coupled with the first conductive line; and a third terminal of the sixth transistor is coupled with the second ground node and a fourth terminal of the sixth transistor is coupled with the second conductive line.

Aspect 23: The apparatus of any of aspects 21 through 22, where the third transistor, the fourth transistor, the fifth transistor, and the sixth transistor is each an nMOS transistor.

Aspect 24: The apparatus of any of aspects 17 through 23, where: the first transistor includes a first terminal coupled with the first conductive line and a second terminal; and the second transistor includes a third terminal coupled with the second conductive line and fourth terminal coupled with a second terminal.

Aspect 25: The apparatus of any of aspects 17 through 24, where the first transistor and the second transistor is each a pMOS transistor.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first driver coupled with a first conductive line of a data bus associated with a memory array;
a second driver coupled with a second conductive line of the data bus; and
a logic circuit configured to selectively couple the first conductive line with the second conductive line based at least in part on transmitting a first voltage from the first driver to the first conductive line at least partially overlapping in time with transmitting a second voltage from the second driver to the second conductive line.

2. The apparatus of claim 1, wherein:
the first driver comprises a first transistor configured to selectively couple the first conductive line with a first supply node based at least in part on a first control signal; and the second driver comprises a second transistor configured to selectively couple the second conductive line with a second supply node based at least in part on a second control signal.

3. The apparatus of claim 2, wherein the logic circuit comprises:

an input configured to receive the first control signal and the second control signal; and an output coupled with a third transistor positioned electrically between the first conductive line and the second conductive line, wherein the logic circuit is configured to activate the third transistor based at least in part on receiving the first control signal at least partially overlapping in time with receiving the second control signal.

4. The apparatus of claim 3, wherein the third transistor is a pMOS transistor.

5. The apparatus of claim 3, wherein the logic circuit comprises a not-and (NAND) gate.

6. The apparatus of claim 2, wherein:

the first driver further comprises a third transistor configured to selectively couple the first conductive line with a first ground node based at least in part on a third control signal; and the second driver further comprises a fourth transistor configured to selectively couple the second conductive line with a second ground node based at least in part on a fourth control signal.

7. The apparatus of claim 6, wherein the first transistor, the second transistor, the third transistor, and the fourth transistor is each an nMOS transistor.

8. The apparatus of claim 2, wherein a third voltage of the first supply node is greater than the first voltage and the second voltage.

9. The apparatus of claim 1, wherein the logic circuit is further configured to isolate the first conductive line from the second conductive line based at least in part on transmitting a third voltage from the first driver to the first conductive line at least partially overlapping in time with transmitting a fourth voltage different from the third voltage from the second driver to the second conductive line.

10. The apparatus of claim 1, wherein the logic circuit is further configured to isolate the first conductive line from the second conductive line based at least in part on transmitting a third voltage different from the first voltage from the first driver to the first conductive line at least partially overlapping in time with transmitting the third voltage from the second driver to the second conductive line.

11. A method, comprising:

transmitting, based at least in part on a first control signal, a first voltage over a first conductive line of a data bus associated with a memory array;

transmitting, based at least in part on a second control signal, a second voltage over a second conductive line of the data bus, wherein transmitting the first voltage over the first conductive line at least partially overlaps in time with transmitting the second voltage over the second conductive line; and coupling the first conductive line with the second conductive line based at least in part on the first control signal and the second control signal.

12. The method of claim 11, further comprising:

receiving the first control signal at a first driver coupled with the first conductive line; and receiving the second control signal at a second driver coupled with the second conductive line, wherein receiving the first control signal at least partially overlaps in time with receiving the second control signal.

13. The method of claim 12, wherein the first driver comprises a first transistor configured to selectively couple the first conductive line with a first supply node based at least in part on receiving the first control signal and the second driver comprises a second transistor configured to selectively couple the second conductive line with a second supply node based at least in part on receiving the second control signal.

14. The method of claim 11, further comprising:

receiving the first control signal and receiving the second control signal at a logic circuit configured to couple the first conductive line with the second conductive line based at least in part on receiving the first control signal at least partially overlapping in time with receiving the second control signal.

15. The method of claim 11, further comprising:

transmitting, based at least in part on a third control signal, the first voltage over the first conductive line;

transmitting, based at least in part on a fourth control signal, a third voltage different from the second voltage over the second conductive line of the data bus, wherein transmitting the first voltage over the first conductive line at least partially overlaps in time with transmitting the third voltage over the second conductive line; and isolating the first conductive line from the second conductive line based at least in part on the third control signal and the fourth control signal.

16. The method of claim 11, further comprising:

transmitting, based at least in part on a third control signal, a third voltage over the first conductive line;

transmitting, based at least in part on a fourth control signal, the third voltage over the second conductive line of the data bus, wherein transmitting the third voltage over the first conductive line at least partially overlaps in time with transmitting the third voltage over the second conductive line; and isolating the first conductive line from the second conductive line based at least in part on the third control signal and the fourth control signal.

17. An apparatus, comprising:

a first circuit comprising a first driver that comprises a first transistor, the first driver having an input coupled with a first signal node and an output coupled with a first conductive line of a data bus associated with a memory array, the first transistor having a gate coupled with the first signal node, and the first transistor having a first terminal coupled with the first conductive line; and a second circuit comprising a second driver that comprises a second transistor coupled with the first transistor, the second driver having an input coupled with a second signal node and an output coupled with a second conductive line of the data bus, the second transistor having a gate coupled with the second signal node and electrically positioned electrically between the first conductive line and the second conductive line, and the second transistor having a second terminal coupled with the second conductive line.

18. The apparatus of claim 17, wherein:

the first circuit further comprises a first inverter having an input coupled with the first signal node and an output coupled with the gate of the first transistor; and the second circuit further comprises a second inverter having an input coupled with the second signal node and an output coupled with the gate of the second transistor.

19. The apparatus of claim 17, wherein:

the first transistor comprises a first terminal coupled with the first conductive line and a second terminal; and the second transistor comprises a third terminal coupled with the second conductive line and fourth terminal coupled with a second terminal.

20. The apparatus of claim 17, wherein the first transistor and the second transistor is each a pMOS transistor.

21. The apparatus of claim 1, wherein the first voltage and the second voltage comprise an equal voltage level.

22. The method of claim 11, wherein the first voltage and the second voltage comprise an equal voltage level.

* * * * *